United States Patent
Taguchi

[19]

[11] Patent Number: 5,985,747
[45] Date of Patent: Nov. 16, 1999

[54] SEMICONDUCTOR DEVICE MANUFACTURING METHOD

[75] Inventor: Mitsuru Taguchi, Tokyo, Japan

[73] Assignee: Sony Corporation, Tokyo, Japan

[21] Appl. No.: 08/948,526

[22] Filed: Oct. 9, 1997

[30] Foreign Application Priority Data

Oct. 15, 1996 [JP] Japan .................................. 8-293379

[51] Int. Cl.⁶ ............................................... H01L 21/4763
[52] U.S. Cl. ............................................. 438/622; 438/632
[58] Field of Search .................................. 438/622, 632, 438/646, 648, 688, 908, 913, 624, 760, 763, 789, 792

[56] References Cited

U.S. PATENT DOCUMENTS

| | | | |
|---|---|---|---|
| 5,650,360 | 7/1997 | Tomita | 438/624 |
| 5,716,869 | 2/1998 | Hibino et al. | 438/632 |

*Primary Examiner*—Charles Bowers
*Assistant Examiner*—Craig Thompson
*Attorney, Agent, or Firm*—Hill & Simpson

[57] ABSTRACT

An underlying Al alloy wiring 3 and an inter-layer insulation film 4 are formed sequentially on a semiconductor substrate 1 via an inter-layer insulation film 2. An inter-layer insulation film 5 highly hygroscopic and containing much moisture is made and etched back to flush depressions by the underlying Al alloy wiring 3. After an inter-layer insulation film 6 is made, a contact-hole C is made in the inter-layer insulation films 6 and 4. After that, prior to making a TiN/Ti film 7, gases are removed from the inter-layer insulation films 4 through 6 by annealing. The TiN/Ti film 7 is made as thick as 80 nm. In an alternative version, after the inter-layer insulation film is etched back, annealing is done to remove gases especially from the inter-layer insulation film 5. In another alternative version, a protective film 9 is made on the side wall of the contact-hole C, or the surface of the inter-layer insulation films 6 and 4 having formed the contact-hole or the surface of the inter-layer insulation film 5, is nitrified, to prevent degassing of the inter-layer insulation films 4 through 6.

9 Claims, 9 Drawing Sheets

SEMICONDUCTOR DEVICE MANUFACTURING METHOD

BACKGROUND OF THE INVENTION

1. Field of the Invention

This invention relates to a semiconductor device manufacturing method especially suitable for a method using high-pressure reflow to plug contact-holes and grooves.

2. Description of the Related Art

Along with high integration of very large scaled integrated circuits, micro-sized inside wiring progresses, and the aspect ratio of contact-holes increases. Therefore, technologies for plugging a wiring material into fine contact-holes having a high aspect ratio is very important.

Recently, researches of so-called plugged wiring technologies are done actively. Plugged wiring technologies pertain to a process of forming a predetermined groove in an inter-layer insulation film, then stacking a film of a wiring material, such as aluminum (Al) or copper (Cu), to plug it into the groove, and thereafter removing the wiring material from portions other than the groove by CMP (chemical mechanical polishing), so as to use the remainder of the wiring material in the groove as a wiring. In such plugged wiring technologies, the technique for plugging a wiring material into a fine groove is important.

There are researches of various techniques, such as blanket tungsten (W) chemical vapor deposition, aluminum (Al) or copper (Cu) high-temperature sputtering, reflow, and high-pressure reflow, as techniques for plugging of fine contact-holes and grooves, and some of them are used actually.

Blanket W CVD is most widely used in practice as a technique for plugging of contact-holes because of its high and stable hole-plugging ability. However, its process is complicated, requiring steps of forming a close-contact layer, forming and back-etching the W film and forming a wiring.

Al or Cu high-temperature sputtering and reflow are simpler in process than the blanket W CVD, and hence contributes to a reduction of the cost. However, they need heating the substrate as high as approximately 500 to 550° C. for plugging of contact-holes, and invite a decrease in reliability of the wiring due to heating the substrate to a high temperature, among others. Moreover, high-temperature sputtering and reflow are inferior in plugging ability, and the maximum aspect ratio, in case of contact-holes, for example, is 2 to 3, approximately. Therefore, these methods are considered inapplicable to more micro-sized devices in the future.

Al or Cu high-pressure reflow is recently remarked as a technology improving the plugging ability of the ordinary reflow. The high-pressure reflow ensures plugging of contact-holes with an aspect ratio around 4 to 5 under an ideal condition, and is appreciated as a hopeful method applicable also to plugging of grooves. FIGS. 1 through 3 show a conventional method for manufacturing a semiconductor device by plugging an Al alloy into a contact-hole by the high-pressure reflow.

In the conventional semiconductor device manufacturing method, first formed, as shown in FIG. 1, is an underlying Al alloy wiring 103 made of an Al—Cu alloy on a semiconductor substrate 101, such as Si wafer, prepared by a predetermined process, via an inter-layer insulation film 102, such as $SiO_2$ film. Next formed on the entire surface is an inter-layer insulation film 104, such as $SiO_2$ film, by chemical vapor deposition (CVD), for example. Thereafter, a predetermined portion of the inter-layer insulation film 104 is selectively etched off by dry etching to form a contact-hole C' down to the underlying Al alloy wiring 103. Symbols x' and y' are the diameter and the depth of the contact-hole C'. Numerical values of x' and y' may be, for example, x'=0.3μm and y'=1μm.

Next stacked as an underlying wiring layer are a titanium (Ti) film and a titanium nitride (TiN) film, in sequence, by sputtering at the temperature of 400° C. of the semiconductor substrate 101 to form a TiN/Ti film 105. The lower Ti film may be 20 nm thick and the upper TiN film 50 nm thick, for example, such that the entirety of the TiN/Ti film 105 be 70 nm thick. Next formed on the TiN/Ti film 105 is an Al alloy film 106, using an Al—Cu alloy, for example, as a wiring main material by sputtering at the temperature of, for example, 400° C. of the semiconductor substrate 101. The thickness of the Al alloy film 106 is chosen to be larger than the diameter x' of the contact-hole C', so as to cover the upper end of the contact-hole C' while making a void inside the contact-hole C'. For example, thickness of the Al alloy film 106 may be 500 nm.

After the Al alloy film 106 is formed, as shown in FIG. 2, the semiconductor substrate 101 is heated to 400 to 450° C. in a highly evacuated atmosphere to soften the Al alloy film 106, and a pressurized gas is introduced to make the Al alloy film 106 run into the contact-hole C' until it fully plugs the contact-hole C' as shown in FIG. 3.

In the conventional semiconductor device manufacturing method, successive steps of forming the TiN/Ti film 105, forming the Al alloy film 106 and high-pressure reflow of the Al alloy film 106 are executed continuously while transporting the semiconductor substrate 101 in a vacuum not to expose it to the atmospheric air.

In the conventional semiconductor device manufacturing method, the plugging ratio of the contact-hole or groove by the high-pressure reflow is very sensitive to the quality of the inter-layer insulation film 104 having the contact-hole or groove. Especially when a large amount of gases of water, etc., are released from the surface of the inter-layer insulation film 104, the plugging ratio decreases seriously. The problem of a gas released from the inter-layer insulation film 104 may occur, for example, in the following case. That is, as the requirement of a flatness of the underlying surface making a wiring increases along with micro-sizing and multi-layered wiring of VLSIs, insulation films excellent in flatness tend to be used frequently. More specifically, the above-explained conventional semiconductor device manufacturing method may use an insulation film with an excellent flatness to flush a step by the underlying Al alloy wiring 103. A known film usable as the insulation film for this purpose is, for example, a $SiO_2$ film formed by atmospheric-pressure CVD using ozone ($O_3$) and tetraethoxysilane (TEOS) as reactive gases. Such a $SiO_2$ film is certainly good in flatness. However, it is highly hygroscopic, and contains much moisture. If the inter-layer insulation film 104 includes a much moist portion, even when the much moist portion is not exposed to the exterior, water, etc., are released to the exterior through the inter-layer insulation film 104, and degrades the plugging ratio.

This occurs for the following reason. That is, in the conventional semiconductor device manufacturing method referred to above, a sequence of steps of forming the TiN/Ti film 105, forming the Al alloy film 106, and high-pressure reflow of the Al alloy film 106 are executed together with heating of the semiconductor substrate 101 around 400 to 450° C., and gases of water, etc., are released from the inter-layer insulation film 104. Since the gases of water, etc. released from the inter-layer insulation film 104 pass through the TiN/Ti film 105 forming the side wall of the contact-hole C', water molecules reach the surface of the TiN/Ti film 105. As a result, as shown in FIG. 4, the surface of the TiN/Ti film 105 is oxidized, and a Ti oxide layer 108 is formed the portion. Once the Ti oxide layer 108 is formed on the surface of the TiN/Ti film 105, the Al alloy film 106 is oxidized along the interface with the TiN/Ti film 105 as shown in FIG. 5 when the Al alloy film 106 runs into the contact-hole C' during high-pressure reflow, and an Al oxide layer 109, such as aluminum dioxide ($Al_2O_3$) in the portion. The Al oxide layer 109 does not run smoothly, and disturbs the reflow of the Al alloy film 106. Supposedly, this is the reason of defective plugging.

This problem is salient when a wiring material is plugged into a micro-sized contact-hole or groove by high-pressure reflow, causing a decrease in reliability of the wiring and an increase of the wiring resistance due to the defective plugging. Therefore, there is a demand for an improved measure that ensures good plugging regardless of the quality of the inter-layer insulation film 104.

OBJECTS AND SUMMARY OF THE INVENTION

It is therefore an object of the invention to provide a semiconductor device manufacturing method promising good plugging when plugging a wiring material into a contact-hole or groove by a high-pressure reflow method.

According to a first aspect of the invention, there is provided a semiconductor device manufacturing method comprising the steps of:

making an inter-layer insulation film at least partly made of an inter-layer insulation film material containing moisture;

making an opening in the inter-layer insulation film;

annealing the inter-layer insulation film to release a gas of water from the inter-layer insulation film material;

making a film of a wiring material on the inter-layer insulation film having formed the opening; and plugging the wiring material into the opening of the inter-layer insulation film by a high-pressure reflow process.

According to a second aspect of the invention, there is provided a semiconductor device manufacturing method comprising the steps of:

making an inter-layer insulation film at least partly made of an inter-layer insulation film material containing moisture;

making an opening in the inter-layer insulation film;

making an underlying wiring layer in the opening;

making a film of a wiring material on the inter-layer insulation film having the opening in which the underlying wiring layer is formed; and plugging the wiring material into the opening of the inter-layer insulation film by a high-pressure reflow process, the underlying wiring layer being as thick as 80 nm or more.

According to a third aspect of the invention, there is provided a semiconductor device manufacturing method comprising the steps of:

making an inter-layer insulation film at least partly made of an inter-layer insulation film material containing moisture;

making an opening in the inter-layer insulation film;

making a protective film at least on a side wall of the opening;

making a film of a wiring material on the inter-layer insulation film having the opening in which the protective film is formed; and plugging the wiring material into the opening of the inter-layer insulation film by a high-pressure reflow process.

According to the first aspect of the invention having the above-mentioned construction, since the step for annealing the inter-layer insulation film to release a gas of water from the inter-layer insulation film material after forming the inter-layer insulation film partly or entirely made of an inter-layer insulation film material containing moisture and before forming a wiring material film, a sufficient amount of the moisture contained in the inter-layer insulation film is released to the exterior before the wiring material film is made. As a result, water molecules released from the inter-layer insulation film during plugging of the wiring material into the opening of the inter-layer insulation film by high-pressure reflow can be reduced. More specifically, water molecules released from the surface of the inter-layer insulation film can be decreased to $5\times10^{17}/cm^2$ or less, for example.

According to the second aspect of the invention having the above-mentioned construction, since the underlying wiring layer is as thick as 80 nm or more, water molecules released from the inter-layer insulation film during plugging of a wiring material into the opening in the inter-layer insulation film by high-pressure reflow are prevented from reaching the surface of the underlying wiring layer.

According to the third aspect of the invention having the above-mentioned construction, since a protective film is formed at least on the side wall of the opening in the inter-layer insulation film, release of gases through the inter-layer insulation film is prevented while the wiring material is plugged into the opening in the inter-layer insulation film by high-pressure reflow.

Therefore, according to the invention, good plugging is expected when a wiring material is plugged into the opening in the inter-layer insulation film by high-pressure reflow. Moreover, the invention enables application of the process using high-pressure reflow to cases using various inter-layer insulation films, such as those using an inter-layer insulation film partly or entirely made of an inter-layer insulation film material containing moisture.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
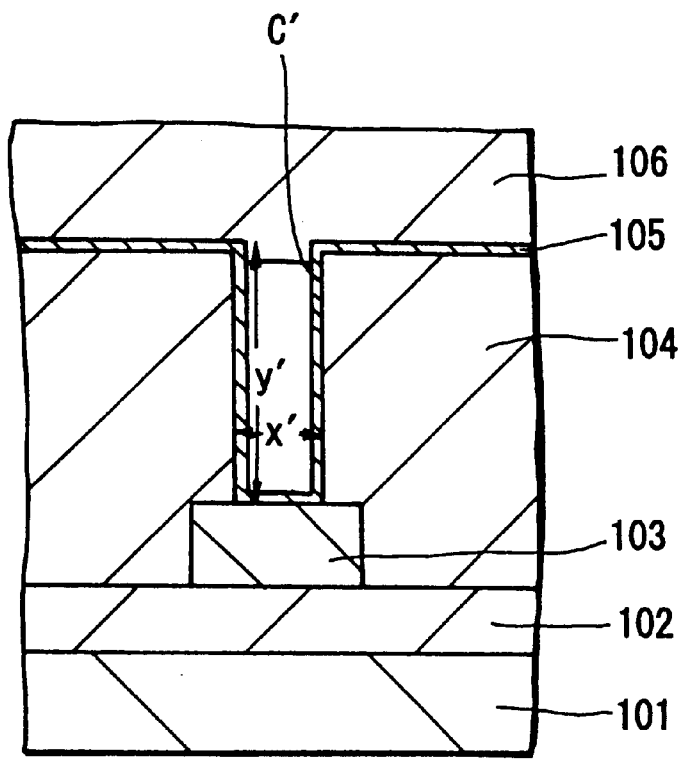
FIG. 1 is a cross-sectional view illustrating a conventional semiconductor device manufacturing method.
Figure 2:
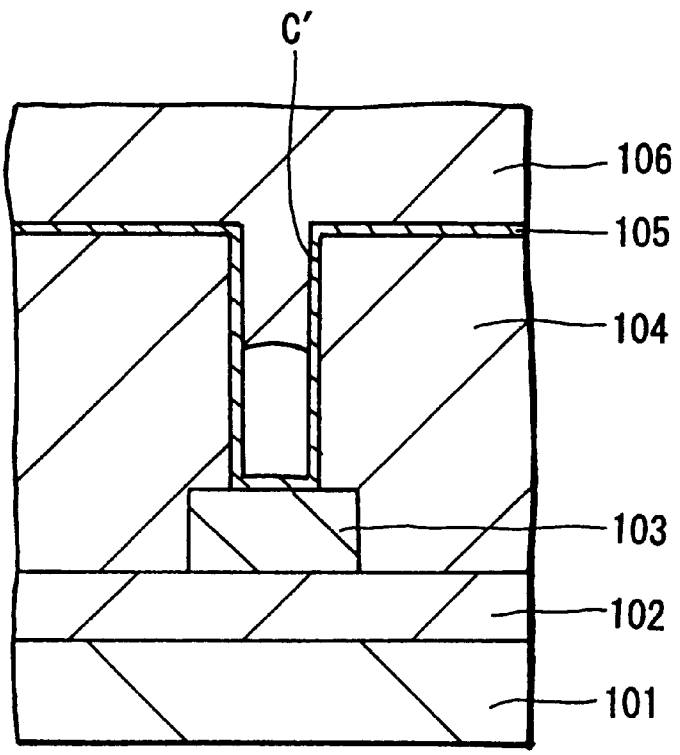
FIG. 2 is a cross-sectional view illustrating the conventional semiconductor device manufacturing method.
Figure 3:
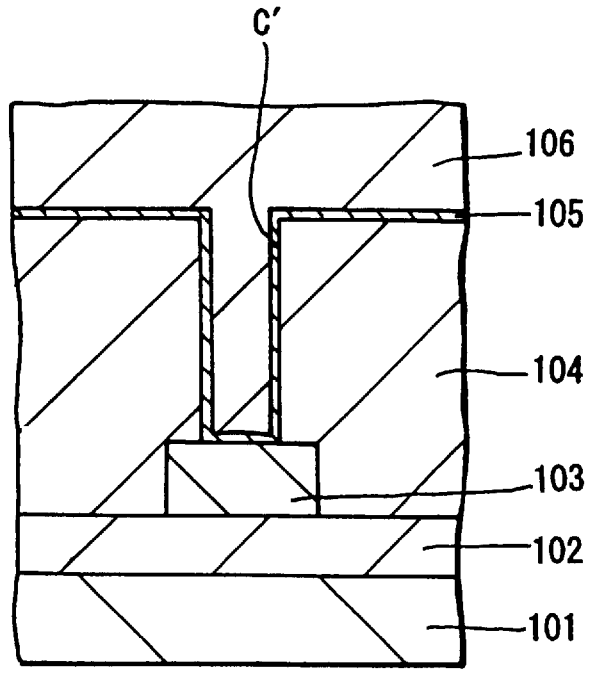
FIG. 3 is a cross-sectional view illustrating the conventional semiconductor device manufacturing method.
Figure 4:
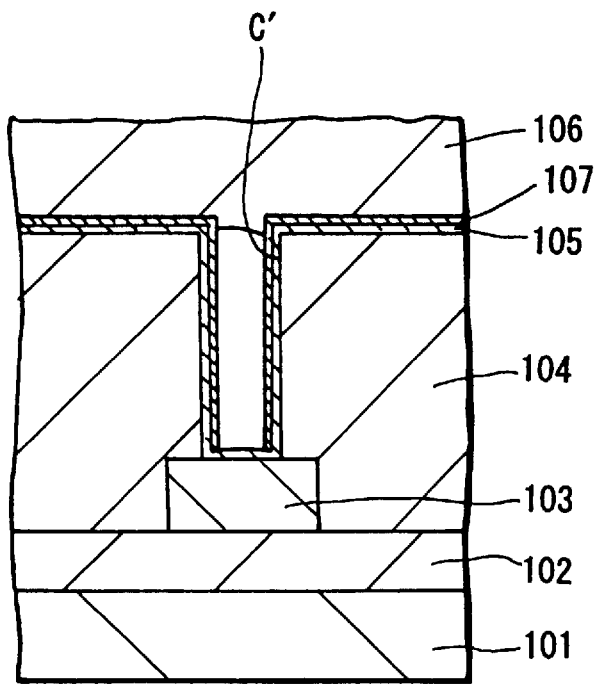
FIG. 4 is a cross-sectional view showing problems involved in the conventional semiconductor device manufacturing method.
Figure 5:
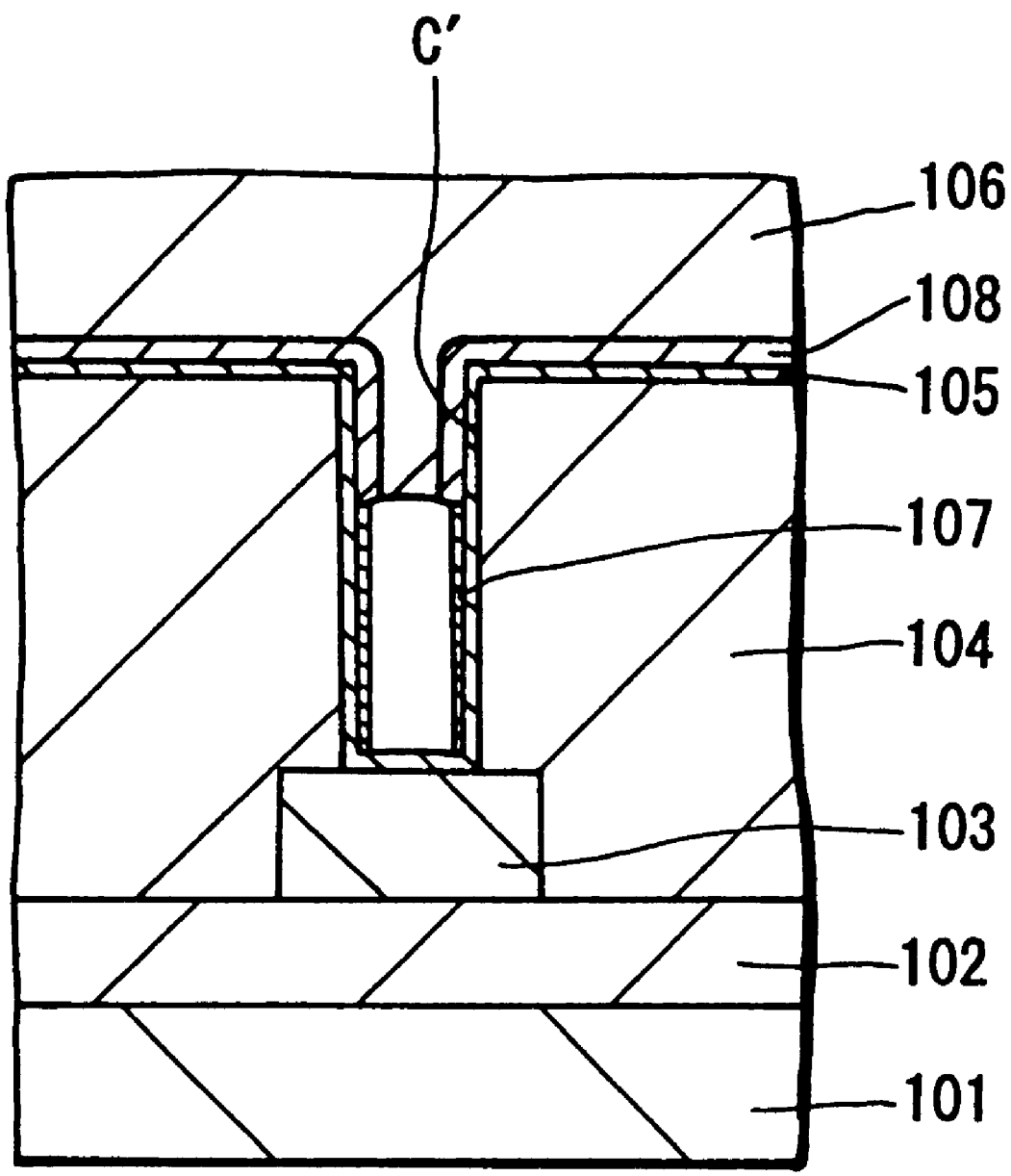
FIG. 5 is a cross-sectional view showing problems involved in the conventional semiconductor device manufacturing method.

Some embodiments of the invention are described below with reference to the drawings. Explanation is made on semiconductor device manufacturing methods for plugging a wiring material into a contact-hole or groove by high-pressure reflow, taking cases where an underlying wiring and an overlying wiring are connected via the contact-hole. In all figures of the embodiments, the same or equivalent elements are labeled with common reference numerals.

Explanation is made on a first embodiment of the invention. FIGS. 6 through 13 illustrate a sequence of steps of the semiconductor device manufacturing method according to the first embodiment.

Figure 6:
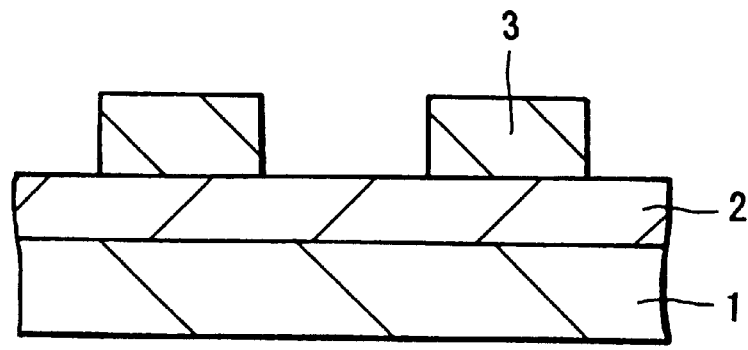
FIG. 6 is a cross-sectional view illustrating a semiconductor device manufacturing method according to a first embodiment of the invention.

In the semiconductor device manufacturing method, an inter-layer insulation film 2 in form of a $SiO_2$ film is first formed by CVD, for example, on a semiconductor substrate 1, such as a Si wafer, previously processed in predetermined steps, as shown in FIG. 6. Next formed on the inter-layer insulation film 2 is a film of an Al alloy, such as Al—Cu, by sputtering. The Al alloy film is thereafter patterned into a predetermined configuration to form an underlying Al alloy wiring 3.

Figure 7:
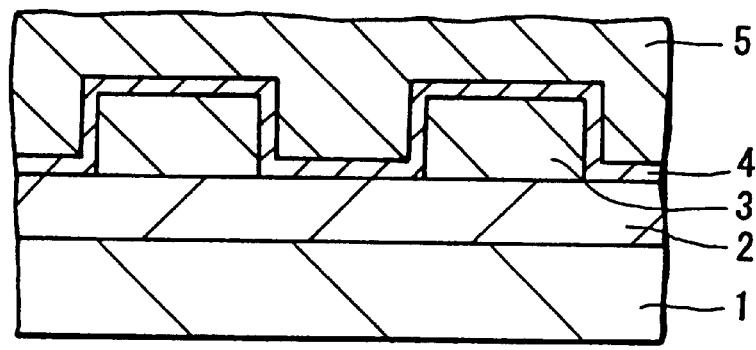
FIG. 7 is a cross-sectional view illustrating the semiconductor device manufacturing method according to the first embodiment of the invention.

Next formed, as shown in FIG. 7, is an inter-layer insulation film 4 in form of $SiO_2$ film to cover the underlying Al alloy wiring 3 by plasma CVD, for example. Next formed on the inter-layer insulation film 4 is an inter-layer insulation film 5 made of $SiO_2$ by atmospheric-pressure CVD, which uses $O_3$ and TEOS as reactive gases and promises an excellent plugging property, so as to flush the surface. Although the inter-layer insulation film 5 is excellent in flatness, it is highly hygroscopic and contains much moisture.

Figure 8:
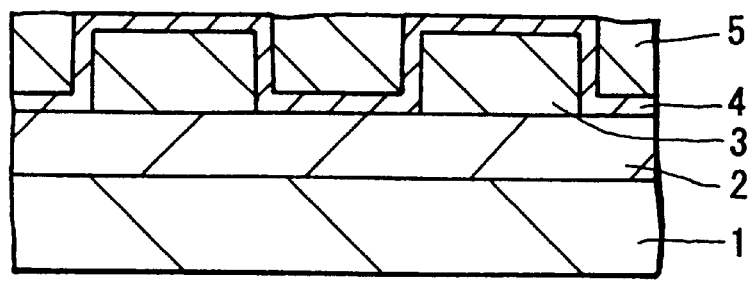
FIG. 8 is a cross-sectional view illustrating the semiconductor device manufacturing method according to the first embodiment of the invention.

As shown in FIG. 8, the inter-layer insulation film 5 is thereafter etched back by reactive ion etching (RIE) until exposing the surface of the inter-layer insulation film 4 on the underlying Al alloy wiring 3. Thus, a flat surface with the inter-layer insulation film 5 filling depressions around the underlying Al alloy wiring 3 is obtained.

Figure 9:
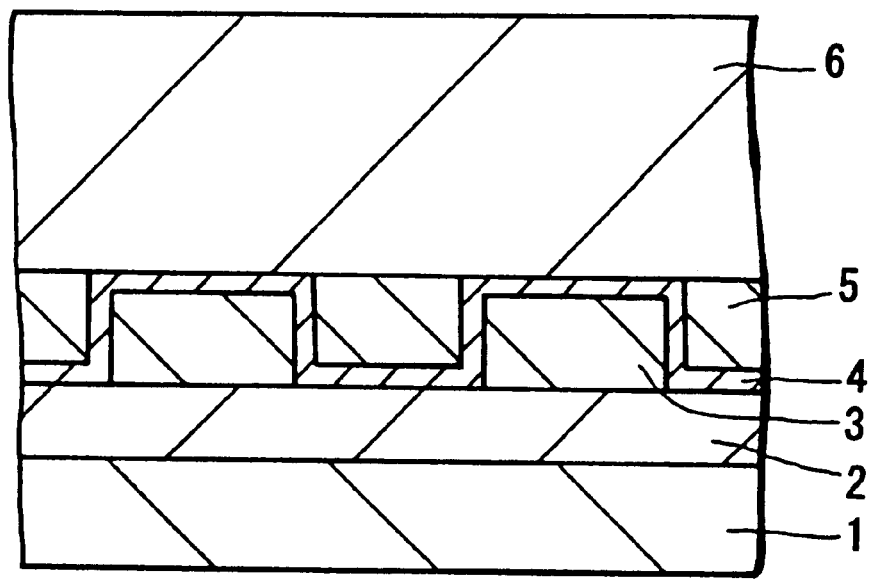
FIG. 9 is a cross-sectional view illustrating the semiconductor device manufacturing method according to the first embodiment of the invention.

As shown in FIG. 9, next formed on the inter-layer insulation film 4 and the inter-layer insulation film 5 is an inter-layer insulation film 6 made $SiO_2$ by plasma CVD, for example.

Figure 10:
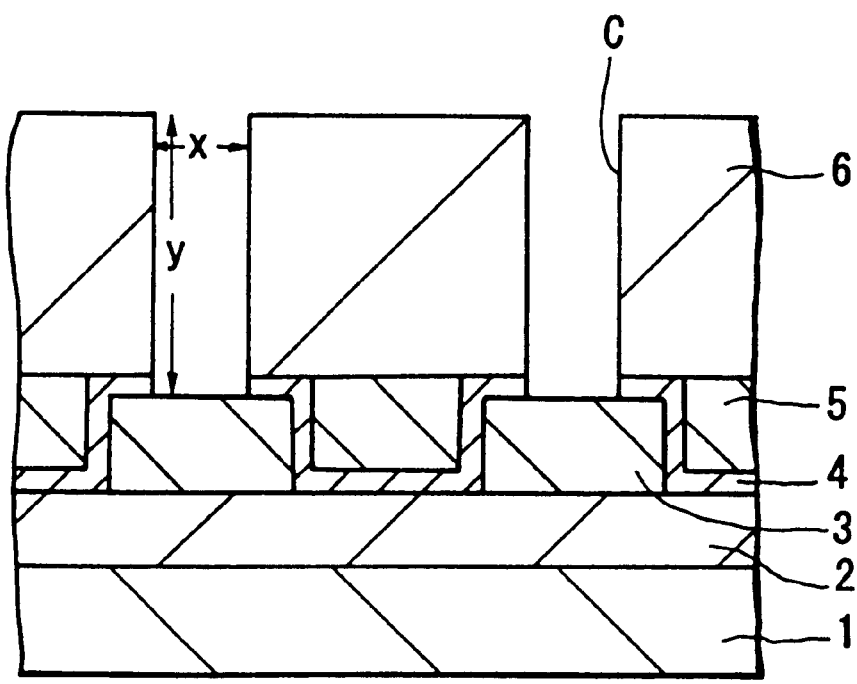
FIG. 10 is a cross-sectional view illustrating the semiconductor device manufacturing method according to the first embodiment of the invention.

After that, a resist pattern (not shown) of a predetermined profile is formed on the inter-layer insulation film 6 by photolithography, for example, and the inter-layer insulation films 6 and 4 are selectively etched off by dry etching, for example, using the resist pattern as a mask. Thus, as shown in FIG. 10, a contact-hole C extending to the underlying Al alloy wiring 3 is made. After that, the resist pattern used as the mask for making the contact-hole C is removed. Symbols x and y denote the diameter and the depth of contact-hole C. The diameter x of the contact-hole C may be approximately 0.3 μm, for example, and the depth y may be approximately 1 μm, for example. In this case, the aspect ratio y/x is about 3.3.

After making the contact-hole C in the inter-layer insulation films 6 and 4, the semiconductor device manufacturing method anneals the semiconductor substrate 1 before making a film of a wiring material for the purpose of releasing moisture contained in the inter-layer insulation films 4 through 6. In this case, since the inter-layer insulation film 5 is most hygroscopic and contains much moisture, the inter-layer insulation film 5 should be degassed sufficiently. Gases of water, etc. released from the inter-layer insulation film 5 by the annealing are discharged to the exterior through the surface of the inter-layer insulation film 6 and the side wall of the contact-hole C.

The annealing of the semiconductor substrate 1 is done at a temperature in the range from 430° C. to 550° C. to ensure effective degassing of the inter-layer insulation films 4 to 6 and to reliably prevent deterioration of the surface of the underlying Al alloy wiring 3. The temperature is preferably in the range of 450° C. to 500° C. More specifically, the annealing of the semiconductor substrate 1 is done in an atmosphere of Ar gas, while heating the semiconductor substrate 1 to 450° C. for 15 minutes, for example.

After the annealing of the semiconductor substrate 1, an oxide film spontaneously made on the underlying Al alloy wiring 3 at the bottom of the contact-hole C is etched off by sputter-etching using Ar gas, for example, as a process gas.

Figure 11:
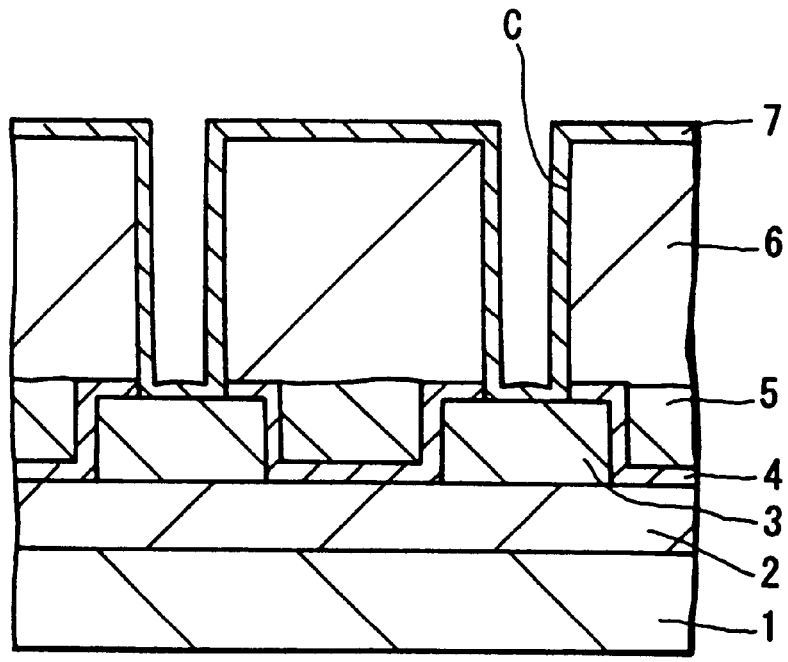
FIG. 11 is a cross-sectional view illustrating the semiconductor device manufacturing method according to the first embodiment of the invention; integrated circuit device.

After that, as shown in FIG. 11, a Ti film and a TiN film are formed in sequence by DC magnetron sputtering, for example, to form a TiN/Ti film 7 as an underlying wiring layer. During deposition of the lower Ti film of the TiN/Ti film 7, the DC power is set to 6 kW, the flow rate of Ar gas to 100 sccm, the pressure to 0.4 Pa, and the deposition temperature to 400° C. During deposition of the upper TiN film, the DC power is set to 12 kW, the flow rate of Ar gas to 20 sccm, the flow rate of $N_2$ gas to 70 sccm, the pressure to 0.4 Pa, and the deposition temperature to 400° C.

The thickness of the Ti film or TiN film of the TiN/Ti film 7, or the entire thickness of these films, at the portion of the contact-hole C, is preferably 80 nm or more, and more preferably, 90 nm. In this case, since the TiN film is less permeable for water molecules than the Ti film, the TiN film is preferably made thicker than the Ti film in the TiN/Ti film 7. The thickness of the lower Ti film may be 20 nm, for example, and the thickness of the upper TiN film may be 100 nm, for example.

Figure 12:
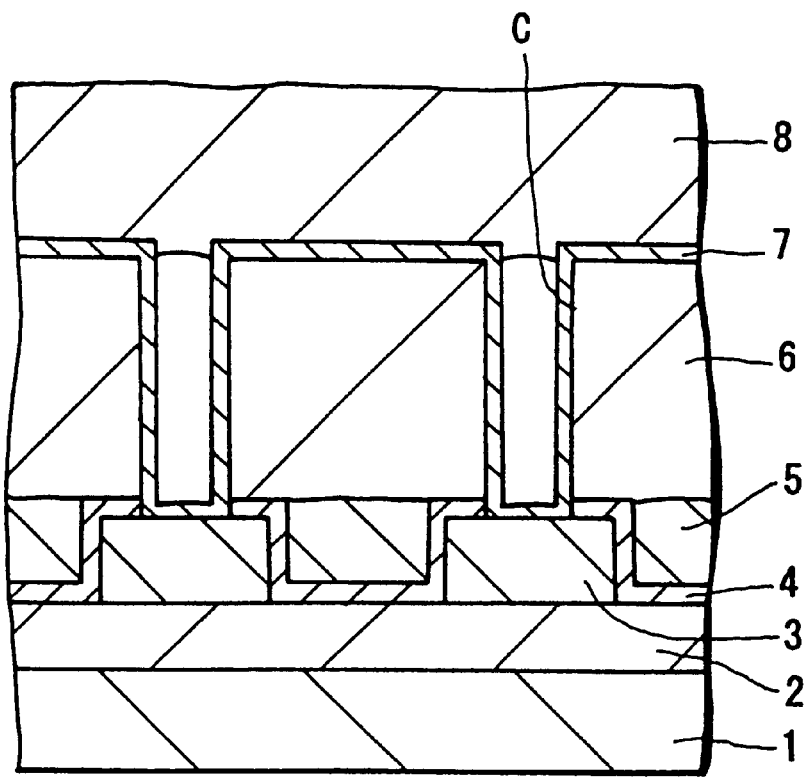
FIG. 12 is a cross-sectional view illustrating the semiconductor device manufacturing method according to the first embodiment of the invention.

After the TiN/Ti film 7 is formed, an Al alloy film 8 as the main wiring layer made of an Al alloy containing 0.5% Cu, for example, is formed on the TiN/Ti film 7 by DC magnetron sputtering as shown in FIG. 12. For making the Al alloy film 8, the DC power is set to 12 kW, the flow rate of Ar gas to 100 sccm, the pressure to 0.4 Pa, and the deposition temperature to 400° C., for example. The thickness of the Al alloy film 8 is chosen to be larger than the diameter x of the contact-hole C, as shown in FIG. 12, so as to cover the upper end of the contact-hole C while making a void inside the contact-hole C. In the example shown here, the thickness of the Al alloy film 8 is 500 nm, for example.

Figure 13:
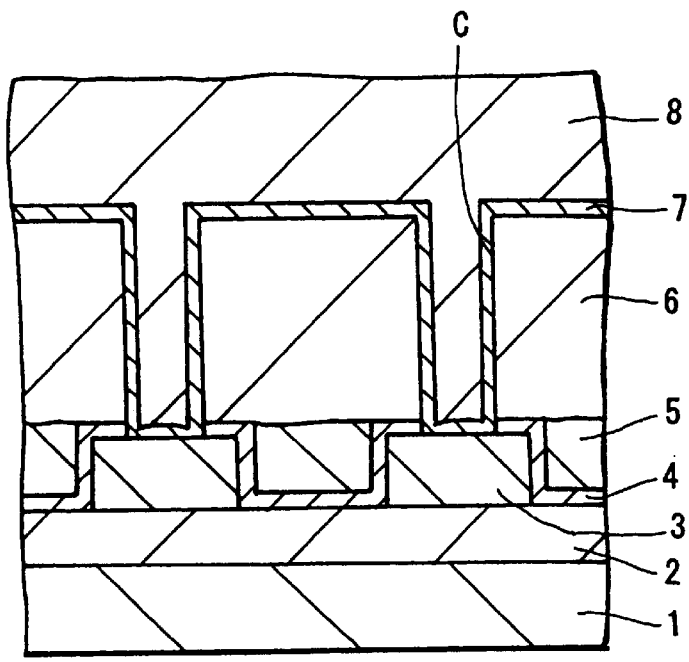
FIG. 13 is a cross-sectional view illustrating the semiconductor device manufacturing method according to the first embodiment of the invention.

After the Al alloy film 8 is made, as shown in FIG. 13, high-pressure reflow is done to make the Al alloy film 8 run and plug into the contact-hole C until fully filling the contact-hole C. For the high-pressure reflow, Ar gas may be used as the process gas, setting the pressure to $7 \times 10^7$ Pa, the temperature of the semiconductor substrate 1 to 450° C. and the heating time to one minute. After that, the Al alloy film 8 and the TiN/Ti film 7 are patterned into a predetermined configuration to form the overlying Al alloy wiring. Thus, the intended semiconductor device is obtained.

In the semiconductor device manufacturing method, the sequence of steps starting from the step of annealing the semiconductor substrate 1 after formation of the contact-hole C to the step of plugging the Al alloy film 8 into the contact-hole C by high-pressure reflow are preferably executed continuously while transporting the semiconductor substrate 1 in a vacuum not to expose the semiconductor substrate 1 to the atmospheric air. Therefore, the example shown here is configured to conduct these steps successively, using a multi-chamber system in which a sputtering system and a high-pressure reflow system are connected by a vacuum transport line.

Since the semiconductor device manufacturing method explained above includes the step of annealing the semiconductor substrate 1 after the step of forming the contact-hole C and before the step of making the TiN/Ti film 7, the inter-layer insulation films 4 to 6 are sufficiently degassed. Especially, moisture contained in the inter-layer insulation film 5 is released sufficiently. As a result, the embodiment can reduce water molecules released from the surface of the inter-layer insulation film 6 in a later sequence of steps for making the TiN/Ti film 7 while heating the semiconductor substrate 1, forming the Al alloy film 8 and plugging the Al alloy 8 into the contact-hole C by high-pressure reflow can. Practically, water molecules released from the surface of the inter-layer insulation film 6 can be reduced to $5 \times 10^{17}/cm^2$ or less by annealing the semiconductor substrate 1 under the above-mentioned conditions.

Figure 14:
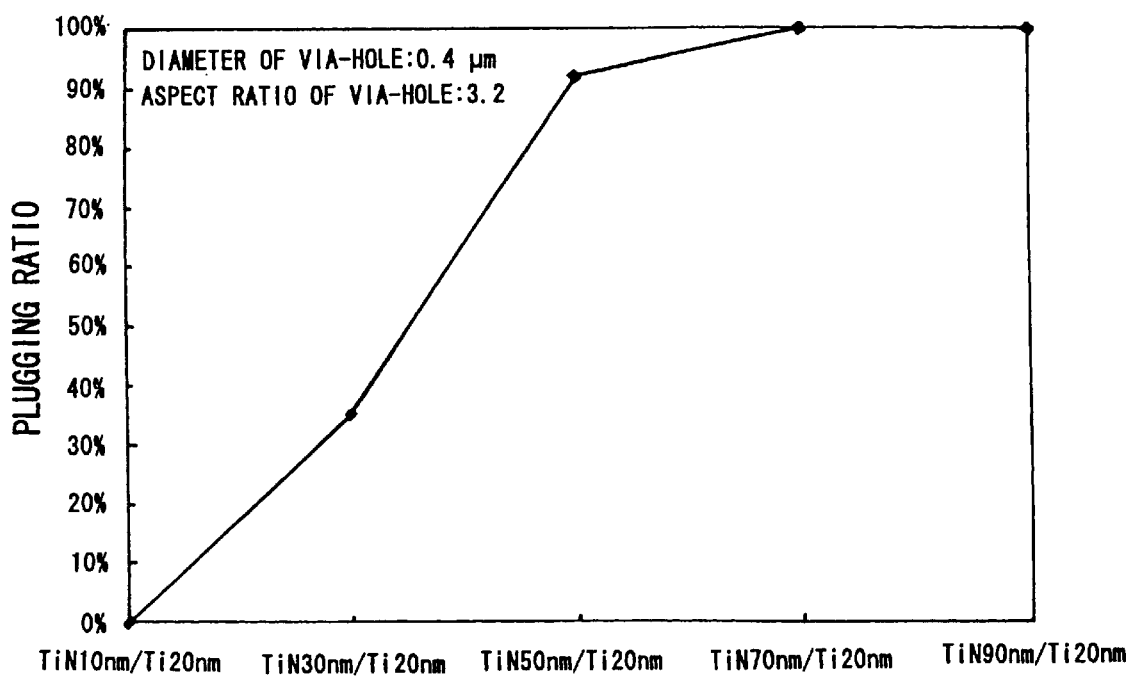
FIG. 14 is a graph showing changes in plugging ratio of a contact-hole with thickness of a TiN/Ti film.

Moreover, since the semiconductor device manufacturing method is configured to make the TiN/Ti film 7 as thick as 80 nm or more (120 nm in this example), it is prevented that water molecules released from the surface of the inter-layer insulation film 6 and from the side wall of the contact-hole C reach the surface of the TiN/Ti film 7 when the semiconductor substrate 1 is heated in the process of making the TiN/Ti film 7 or in the later process of making the Al alloy film 8 and executing high-pressure reflow of the Al alloy film 8. FIG. 14 is a graph showing changes in plugging ratio of the contact-hole C with thickness of the TiN/Ti film 7. The graph is a result of measurement of the plugging ratio of the contact-hole C by fixing the thickness of the lower Ti film of the TiN/Ti film 7 to 20 nm and varying the thickness of the upper TiN layer in devices with the contact-hole C having the diameter of 0.4 $\mu$m and the aspect ratio of 3.2. The graph shows that the plugging ratio of the contact-hole C tends to increase with the thickness of the TiN/Ti film 7 and that the plugging ratio is insufficient when the thickness of the TiN/Ti film 7 is decreased to approximately 70 nm or less (the thickness of the TiN film is approximately 50 nm or less). However, when the TiN/Ti film 7 is as thick as 80 nm or more, the plugging ratio of the contact-hole C is 100%, that is, plugging is complete.

Therefore, the semiconductor device manufacturing method, which reliably prevents penetration of water molecules from the inter-layer insulation film 4 through 6 onto the surface of the TiN/Ti film 7, improves the plugging property upon plugging the Al alloy film 8 into the contact-hole C by high-pressure reflow. As a result, when the Al alloy film 8 forms a wiring, reliability of the wiring is improved, and the wiring resistance is decreased. Moreover, the process using high-pressure reflow can be applied to any other methods using an inter-layer insulation film 5 which is highly hygroscopic and contains much moisture.

Next explained is a second embodiment of the invention. As explained above, the semiconductor device manufacturing method according to the first embodiment of the invention degasses the inter-layer insulation films 4 to 6 by annealing the semiconductor substrate 1 after the process of making the contact-hole C and before making the TiN/Ti film 7. In this process, particular attention must be paid to degassing the inter-layer insulation film 5 highly hygroscopic and containing much moisture. Unless the inter-layer insulation film 5 is sufficiently degassed, water molecules released from the inter-layer insulation film 5 readily pass through the inter-layer insulation film 7 and reach the side wall of the contact-hole C even when the inter-layer insulation film 5 itself is not exposed to the side wall of the contact-hole C. Therefore, it is essential to degas the highly hygroscopic inter-layer insulation film 5 effectively. To cope with the problem, the semiconductor device manufacturing method according to the invention is arranged to anneal the semiconductor substrate 1 while the inter-layer insulation film 5 is still exposed to the exterior.

More specifically, the semiconductor device manufacturing method shown here follows the same steps as those of the semiconductor device manufacturing method according to the first embodiment up to the step of etching back the inter-layer insulation film 5 until obtaining the aspect of shown in FIG. 8 where the highly hygroscopic inter-layer insulation film 5 is exposed to the exterior. In this status, the semiconductor substrate 1 is annealed, for example, to release gases most from the inter-layer insulation film 5. The annealing of the semiconductor substrate 1 is done in an atmosphere of nitrogen ($N_2$) gas, using an annealing furnace, for example, while heating the semiconductor substrate to 450° C., for example, for 15 minutes, for example.

After the annealing, like the semiconductor device manufacturing method according to the first embodiment, the second embodiment continues the step of making the inter-layer insulation film 6, the step of making the contact-hole C, the step of removing the spontaneous oxide film from the surface of the underlying Al alloy wiring 3 at the bottom of the contact-hole C, and subsequent steps as from making the TiN/Ti film 7. In the other respect, the second embodiment is the same as the first embodiment, and explanation thereof is omitted here.

According to the semiconductor device manufacturing method by the second embodiment, since the semiconductor substrate 1 is annealed after the inter-layer insulation film 5 highly hygroscopic and containing much moisture is formed and while the inter-layer insulation film 5 is still exposed to the exterior, gases of water, etc. can be released effectively from the inter-layer insulation film 5. As a result, also the method according to the second embodiment promises the same effects as those of the first embodiment.

Figure 15:
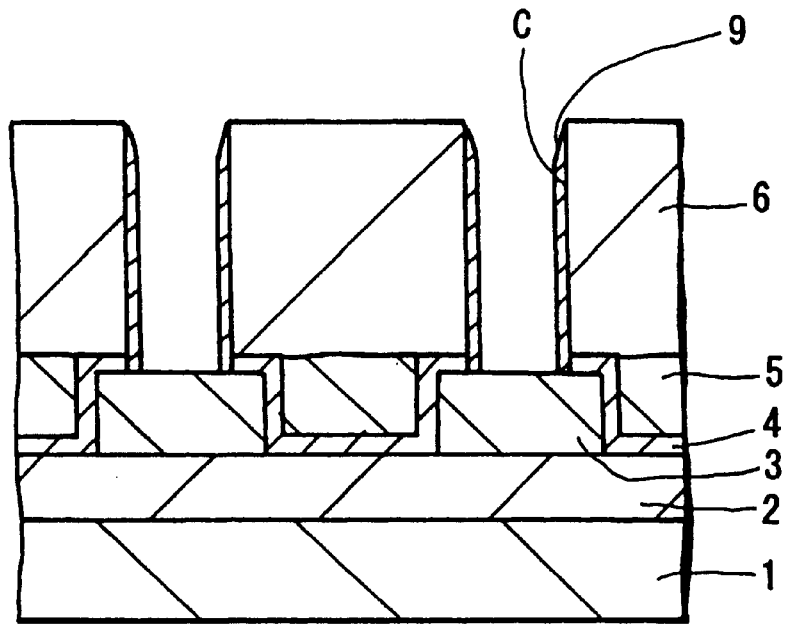
FIG. 15 is a cross-sectional view illustrating a semiconductor device manufacturing method according to a third embodiment of the invention.

Next explained is a third embodiment of the invention. The semiconductor device manufacturing method according to the third embodiment follows the same steps as those of the first embodiment up to the step of forming the contact-hole C in the inter-layer insulation films 6 and 4. After that, a SiN film is formed on the entire surface of the product by plasma CVD, for example, and the SiN film is subsequently etched back by dry etching to form a protective film 9 on the side wall of the contact-hole C as shown in FIG. 15.

In the other respect, the third embodiment is the same as the first embodiment, and explanation thereof is omitted here.

According to the semiconductor device manufacturing method by the third embodiment, the protective film 9 made of SiN is formed on the side wall of the contact-hole C after the contact-hole C is formed and before the TiN/Ti film 7 is formed. Since water does not readily penetrate the protective film 9, gases released from the inter-layer insulation films 4 through 6, especially gases of water, etc. released from the highly hygroscopic inter-layer insulation film 5, are prevented from reaching the surface of the TiN/Ti film 7 during the subsequent process from the step of making TiN/Ti film 7 to the step of high-pressure reflow of the Al alloy film 8. As a result, the plugging property of the contact-hole C by high-pressure reflow is improved, and the same effects as those of the first embodiment are obtained.

Figure 16:
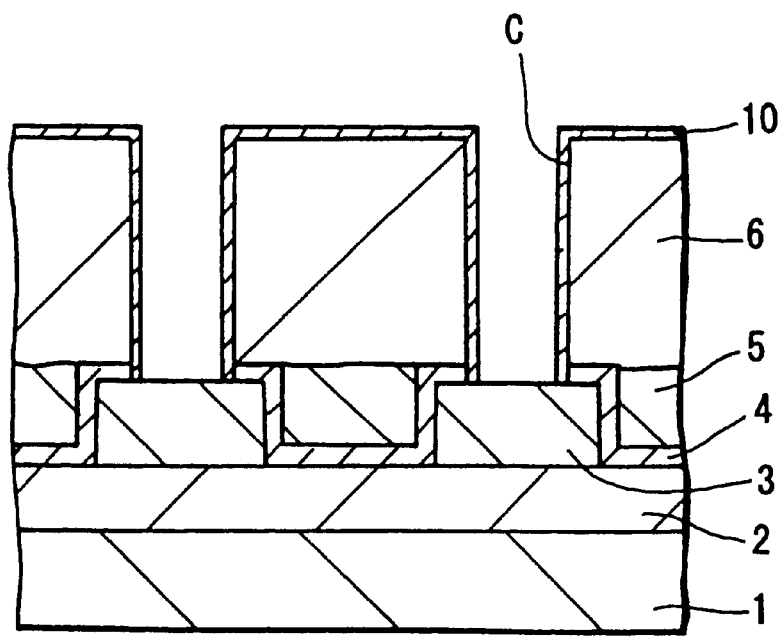
FIG. 16 is a cross-sectional view illustrating a semiconductor device manufacturing method according to a fourth embodiment of the invention.

Next explained is a fourth embodiment of the invention. The semiconductor device manufacturing method according to the fourth same steps as those he same steps as those of the first embodiment up to the step of making the contact-hole C in the inter-layer insulation films 6 and 4. After that, the externally exposed surfaces of the inter-layer insulation films 6 and 4 are nitrified to form a SiN film 10 there as shown in FIG. 16. For the nitriding, an ECR-type plasma nitriding process, for example, may be used. In the ECR-type plasma nitriding process, a mixed gas containing hydrogen ($H_2$), ammonia ($NH_3$) and Ar gases, for example, is used as the process gas, setting the flow rate of $H_2$ gas to 30 sccm, the flow rate of $NH_3$ gas to 8 sccm, the flow rate of Ar gas to 170 sccm, the pressure to 0.23 Pa, the microwave power to 2300 W, and the heating temperature of the semiconductor substrate 1 to 400° C. Also usable as the process gas is $N_2$ gas in lieu of $NH_3$ gas. The thickness of the SiN film 10 made by the plasma nitriding process is preferably 5 nm or more. In this example, the thickness of the SiN film 10 is chosen to be 10 nm, for example.

After that, the TiN/Ti film 7 is formed in the same steps as those of the first embodiment. In this case, the lower Ti film may be 20 nm thick, and the upper TiN film of the TiN/Ti film 7 may be 50 nm thick, and the TiN/Ti film 7 is formed. In the other respect, the fourth embodiment is the same as the first embodiment, and explanation thereof is omitted here.

According to the semiconductor device manufacturing method by the fourth embodiment, since the externally exposed surfaces of the inter-layer insulation films 6 and 4 having formed the contact-hole C are nitrified after the contact-hole C is formed in the inter-layer insulation films 6 and 4 and before the TiN/Ti film 7 is formed, the SiN film 10 is made there. The SiN film 10 prevents that gases released from the inter-layer insulation films 4 through 6, especially gases of water, etc. released from the highly hygroscopic inter-layer insulation film 5, run to the surface of the TiN/Ti film 7 in the subsequent process from the step of making the TiN/Ti film 7 to the step of high-pressure reflow of the Al alloy film 8. As a result, the plugging property of the contact-hole C by high-pressure reflow is improved, and the same effects as those of the first embodiment are obtained.

Next explained is a fifth embodiment of the invention. The foregoing fourth embodiment nitrifies exposed surfaces of the inter-layer insulation films 6 and 4 having the contact-hole C to prevent degassing of the inter-layer insulation films 4 through 6. In this case, however, particular attention must be paid to gases released from the inter-layer insulation film 5 most hygroscopic and containing much moisture among the inter-layer insulation films 4 thorough 6, and it is important to prevent release of gases from the highly hygroscopic inter-layer insulation film. To cope with the problem, the semiconductor device manufacturing method according to the fifth embodiment includes a step of nitrifying the surface of the inter-layer insulation film 5 while the inter-layer insulation film 5 is still exposed externally.

Figure 17:
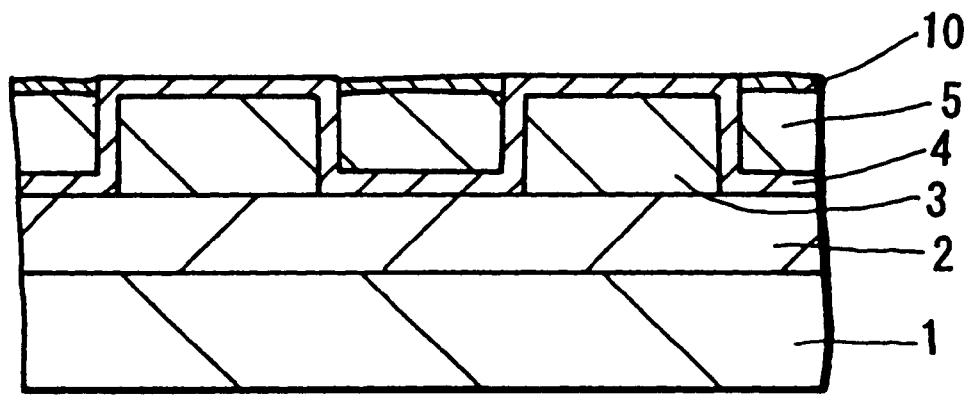
FIG. 17 is a cross-sectional view illustrating a semiconductor device manufacturing method according to a fifth embodiment of the invention.

More specifically, the semiconductor device manufacturing method according to the invention follows the same steps as those of the first embodiment up to the step of etching back the inter-layer insulation film 5. After that, while the inter-layer insulation film 5 is still exposed externally, as shown in FIG. 8 showing the first embodiment, the surface of the inter-layer insulation film 5 is nitrified to form the SiN film 10 on the externally exposed surface of the inter-layer insulation film 5 as shown in FIG. 17. For the nitriding, an ECR-type plasma nitriding process, for example, may be used like the foregoing fourth embodiment.

After that, like the semiconductor device manufacturing method according to the first embodiment, the fifth embodiment continues the step of making the inter-layer insulation film 6, the step of making the contact-hole C, the step of removing the spontaneous oxide film from the surface of the underlying Al alloy wiring 3 at the bottom of the contact-hole C, and subsequent steps as from making the TiN/Ti film 7. In the other respect, the fifth embodiment is the same as the fourth embodiment, and explanation thereof is omitted here.

According to the semiconductor device manufacturing method by the fifth embodiment, since the inter-layer insulation film 5 most liable to cause the problem of degassing is nitrified while its surface is still exposed externally, degassing of the inter-layer insulation film 5 is effectively prevented, and gases of water, etc. released from the inter-layer insulation film 5 are prevented from running to the surface of the TiN/Ti film 7. As a result, the plugging property upon plugging the Al alloy film 8 into the contact-hole C by high-pressure reflow is improved, and the same effects as those of the first embodiment can be obtained.

For example, the first to fifth embodiments are applicable also to plugging the Al alloy film 8 into a groove by high-pressure reflow or to cases where a spin-on glass (SOG) film is used as the highly hygroscopic inter-layer insulation film 5.

Although the first to fifth embodiments have been described as using an Al—Cu alloy as the material of the main wiring layer (Al alloy film 8), the material may be pure Al, or another appropriate Al alloy, such as Al—Si, Al—Si—Cu and Al—Ge. Also usable as the wiring material are silver (Ag) or Cu in lieu of Al-based materials.

Although the first to fifth embodiments have been described as using the TiN/Ti film 7 as the underlying wiring layer, a Ti film, TiN film, TiW film, W film, or their stackingfilm, may be used as the underlying wiring layer. A possible stackingfilm is a Ti/TiN/Ti film, for example.

Although the first and second embodiments have been described as annealing the semiconductor substrate 1 after forming the contact-hole and before forming the TiN/Ti film 7, or after etching back the inter-layer insulation film 5 and while the inter-layer insulation film 5 is still exposed externally, the annealing of the semiconductor substrate 1 may be done in any stage after the inter-layer insulation film 5 highly hygroscopic and containing much moisture is formed and before the TiN/Ti film 7 as the underlying wiring layer is formed.

Although the first embodiment has been described as using a multi-chamber system for annealing the semiconductor substrate 1 executed after the step of forming the contact-hole C and before the step of forming the TiN/Ti film 7, any other annealing system, such as an ordinary annealing furnace, may be used for annealing the semiconductor substrate 1. When using an annealing furnace, the same conditions as those used in the second embodiment for annealing the semiconductor substrate 1 may be used. When an annealing furnace is used for annealing the semiconductor substrate 1, the semiconductor substrate 1 is inevitably exposed to the atmospheric air when it is moved to and from the annealing furnace. However, the amount of moisture absorbed into the inter-layer insulation films 4 through 6 will be negligibly small.

In the second embodiment, the semiconductor substrate 1 may be annealed once again after making the contact-hole C and before making the TiN/Ti film 7. The latter annealing may be done under the same conditions as those of the first embodiment, for example.

In the third embodiment, an amorphous Si film may be used as the protective film 9 in lieu of the SiN film, and the fourth and fifth embodiments may be modified to employ a parallel-plate-type or magnetron-type plasma ni riding process instead of the ECR-type plasma nitriding process.

Figure 18:
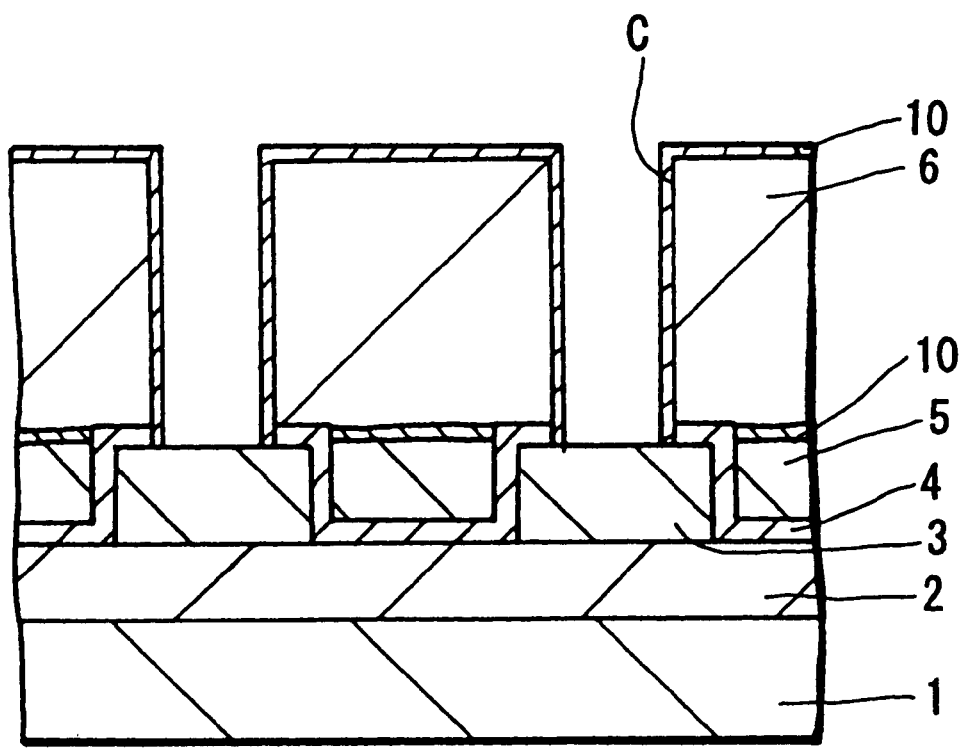
FIG. 18 is a cross-sectional view illustrating a modified version of the semiconductor device manufacturing method according to the fifth embodiment of the invention.

In the fifth embodiment, the inter-layer insulation films 6 and 4 may be nitrified after the contact-hole C is formed therein to form a SiN film 10 on the externally exposed surfaces of the inter-layer insulation films 6 and 4 as shown in FIG. 18. In this nitriding process, the same conditions as those of the fourth embodiment, for example, may be used.

As described above, according to the invention, improved plugging is ensured upon plugging a wiring material into an opening of an inter-layer insulation film including a layer made of a moisture-containing inter-layer insulation film material by using a high-pressure reflow process, by annealing the inter-layer insulation film to release a gas of water from the inter-layer insulation film material after making the inter-layer insulation film and before making a film of a wiring material, or by making an underlying wiring layer as thick as 80 nm or more, or by making a protective film at least on the side wall of an opening in the inter-layer insulation film. Additionally, the invention enables the use of the high-pressure reflow process to various applications using various inter-layer insulation films, such as those partly or entirely made of a moisture-containing inter-layer insulation film.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. A semiconductor device manufacturing method comprising the steps of:

making an inter-layer insulation film at least partly made of an inter-layer insulation film material containing moisture;

making an opening in said inter-layer insulation film;

annealing said inter-layer insulation film to release a gas of water from said inter-layer insulation film material;

making a film of a wiring material on said inter-layer insulation film having formed said opening; and plugging said wiring material into said opening of the inter-layer insulation film by a high-pressure reflow process.

2. The semiconductor device manufacturing method according to claim 1 wherein the step of annealing the inter-layer insulation film, the step of making a film of the wiring material and the step of plugging the wiring material into the opening by the high-pressure reflow process are executed continuously in a vacuum without exposing the product into the atmospheric air.

3. The semiconductor device manufacturing method according to claim 1 wherein the step of annealing the inter-layer insulation film is done before another inter-layer insulation film material makes a film on the moisture-containing inter-layer insulation film material.

4. The semiconductor device manufacturing method according to claim 1 wherein the step of annealing the inter-layer insulation film is subsequent to the step of making the opening in the inter-layer insulation film and prior to the step of making the film of the wiring material.

5. The semiconductor device manufacturing method according to claim 1 wherein the step of annealing the inter-layer insulation film is done at a temperature in the range from 430° C. to 550° C.

6. The semiconductor device manufacturing method according to claim 1 wherein the step of annealing the inter-layer insulation film is done at a temperature in the range from 450° C. to 500° C.

7. The semiconductor device manufacturing method according to claim 1 wherein said opening is a contact-hole.

8. The semiconductor device manufacturing method according to claim 1 wherein said opening is a groove for a damascene wiring.

9. The semiconductor device manufacturing method according to claim 1 wherein the amount of water molecules released from the inter-layer insulation film during the process from the step of making the film of the wiring material to the step of plugging the wiring material in the opening by the high-pressure reflow process is not larger than $5 \times 10^{17}/cm^2$.

* * * * *